United States Patent
Katsaros et al.

(10) Patent No.: US 9,629,263 B2
(45) Date of Patent: Apr. 18, 2017

(54) APPARATUS AND SYSTEM FOR MULTIFUNCTION CAMMING SUPPORT SHELF

(71) Applicant: LENOVO Enterprise Solutions (Singapore) PTE. LTD., New Tech Park (SG)

(72) Inventors: Anthony F. Katsaros, Raleigh, NC (US); Brian M. Kerrigan, Cary, NC (US); Timothy A. Meserth, Durham, NC (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 14/822,786

(22) Filed: Aug. 10, 2015

(65) Prior Publication Data

US 2017/0048992 A1 Feb. 16, 2017

(51) Int. Cl.
| | |
|---|---|
| H05K 7/14 | (2006.01) |
| G06F 1/18 | (2006.01) |
| H05K 5/02 | (2006.01) |
| H05K 7/16 | (2006.01) |
| H02B 1/36 | (2006.01) |

(52) U.S. Cl.
CPC ........... *H05K 5/0204* (2013.01); *H02B 1/36* (2013.01); *H05K 7/1411* (2013.01); *H05K 7/16* (2013.01); *G06F 1/188* (2013.01)

(58) Field of Classification Search
CPC ....... H05K 7/1411; G06F 1/181; G06F 1/184; G06F 1/187; G06F 1/188
See application file for complete search history.

(56) References Cited

U.S. PATENT DOCUMENTS

| | | | |
|---|---|---|---|
| 4,601,445 A | * | 7/1986 | Duclos ............ B64D 7/00 244/137.4 |
| 5,010,426 A | * | 4/1991 | Krenz ............ G11B 25/043 360/137 |

(Continued)

FOREIGN PATENT DOCUMENTS

WO WO9741500 A1 11/1997

OTHER PUBLICATIONS

"Sun Blade™ X6275 Server Module Installation Guide", 2009 Sun Microsystems.

*Primary Examiner* — Adrian S Wilson
(74) *Attorney, Agent, or Firm* — Kunzler Law Group

(57) ABSTRACT

An apparatus includes a multifunction shelf rotatably coupled to a chassis at one or more pivot points. The chassis includes a sub-chassis mounted in a first end of the chassis and connected to one or more connectors within the chassis. The multifunction shelf includes one or more first lever arms extending away from a pivot point. The multifunction shelf also includes one or more second lever arms, each second lever arm connecting to a first lever arm and extends in a direction at a first angle to the connected first lever arm. The multifunction shelf also includes one or more camming features each coupled to a second lever arm and the sub-chassis. Rotating the one or more first lever arms away from the chassis applies a force through each corresponding camming feature to the sub-chassis to disconnect the sub-chassis from the chassis.

20 Claims, 8 Drawing Sheets

(56) References Cited

U.S. PATENT DOCUMENTS

| | | | |
|---|---|---|---|
| 5,077,722 A * | 12/1991 | Geist | G11B 33/121 360/137 |
| 5,325,263 A * | 6/1994 | Singer | G06F 1/184 361/679.39 |
| 5,768,097 A | 6/1998 | Jelinger | |
| 5,791,753 A * | 8/1998 | Paquin | H05K 7/1411 312/223.1 |
| 6,137,684 A | 10/2000 | Ayd et al. | |
| 6,144,549 A | 11/2000 | Moss et al. | |
| 6,222,736 B1 * | 4/2001 | Sim | G06F 1/184 361/727 |
| 6,816,367 B2 * | 11/2004 | Liu | G06F 1/187 248/200 |
| 6,891,728 B1 * | 5/2005 | Mease | G06F 1/183 312/333 |
| 7,210,751 B2 * | 5/2007 | Nakayama | H01M 2/1077 312/223.1 |
| 7,307,835 B1 | 12/2007 | Barina et al. | |
| 7,515,428 B2 * | 4/2009 | Tang | G06F 1/188 361/727 |
| 7,771,218 B2 * | 8/2010 | Jaramillo | H05K 7/1492 439/157 |
| 8,231,396 B2 * | 7/2012 | Kangas | H05K 7/1411 361/727 |
| 8,289,707 B2 * | 10/2012 | Liao | H04Q 1/023 361/679.58 |
| 8,724,330 B1 | 5/2014 | Dittus et al. | |
| 2002/0104396 A1 * | 8/2002 | Megason | F16H 51/00 74/109 |
| 2006/0193112 A1 | 8/2006 | Cauthron | |
| 2007/0053155 A1 * | 3/2007 | Lai | G06F 1/181 361/679.02 |
| 2007/0279858 A1 | 12/2007 | Grady et al. | |
| 2008/0101040 A1 | 5/2008 | Tang | |
| 2008/0123284 A1 | 5/2008 | Jaramillo et al. | |
| 2009/0080165 A1 * | 3/2009 | Barina | H05K 7/1411 361/747 |
| 2011/0279973 A1 | 11/2011 | Terwilliger et al. | |
| 2012/0281350 A1 | 11/2012 | Tanaka et al. | |

* cited by examiner

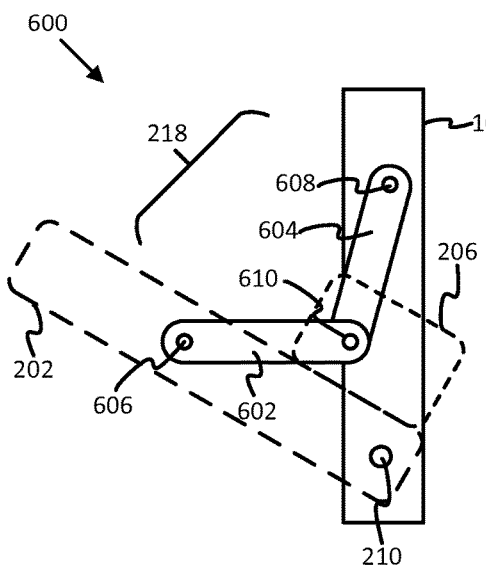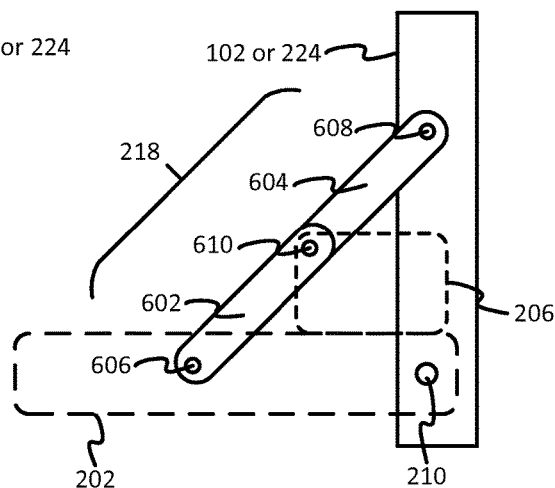
FIG. 6A    FIG. 6B
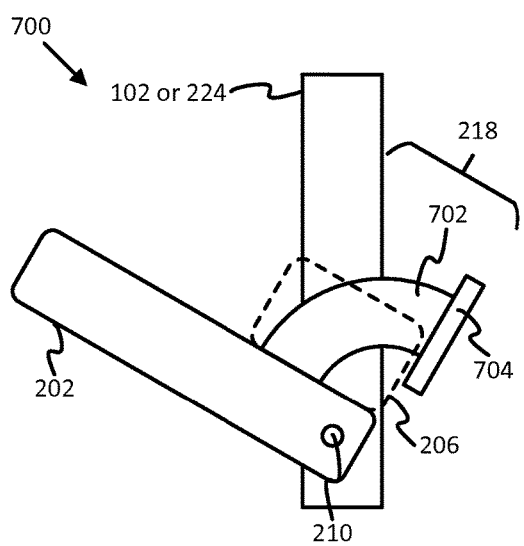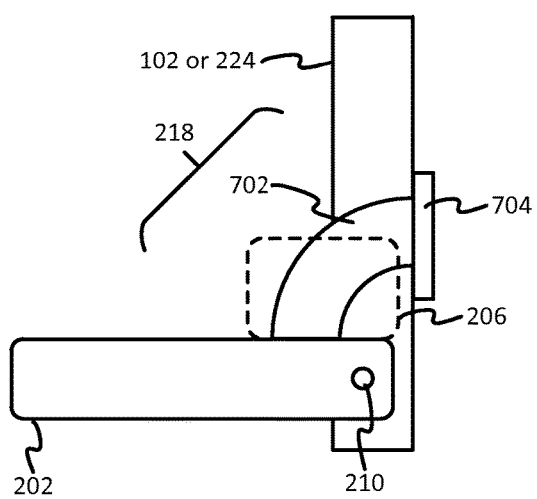
FIG. 7A    FIG. 7B

APPARATUS AND SYSTEM FOR MULTIFUNCTION CAMMING SUPPORT SHELF

BACKGROUND

Field

The subject matter disclosed herein relates to support shelves for computer racks and more particularly relates to a multifunction camming support shelf.

Description of the Related Art

Servers and other computing devices mounted in racks can be very heavy, many weighing over 100 pounds (about 45 kilograms). Furthermore, server racks can be very tall and can have positions for computing devices located above the height that a user can comfortably reach. Additionally, many computing devices mountable in a server rack are made up of many different parts that require a large amount of force to couple together or to disconnect from one another. Thus, a user lifting a heavy portion of a server computing device, such as a power supply or node interconnect sub-device, into a position in the rack above his or her height would have a very difficult time simultaneously lifting the device, positioning the device so that it aligns with the desired position in the server rack, and pushing the server computing device portion with enough force to connect it with the rest of the server.

Conversely, when removing the computing device from its position in the server rack, a high amount of force is needed to disconnect the computing device from the rest of the server. At the same time, a user must also move the device out of the position on the server rack and support the weight of the computing device. Because of the weight of the computing device, this situation is dangerous and could result in injury to the user as well as damage to the computing device if dropped.

BRIEF SUMMARY

An apparatus and system for a multifunction camming support shelf is disclosed. The apparatus includes a multifunction shelf rotatably coupled to a chassis at one or more pivot points. The chassis is sized for a computer rack and to hold one or more electronic components. The chassis includes a sub-chassis mounted in a first end of the chassis. The sub-chassis is connected to one or more connectors within the chassis. The multifunction shelf includes one or more first lever arms. Each lever arm extends away from a pivot point of the one or more pivot points. The multifunction shelf also includes one or more second lever arms, where each second lever arm is connected to a first lever arm and extends in a direction at a first angle to the connected first lever arm. The multifunction shelf also includes one or more camming features. Each camming feature is coupled to a second lever arm and the sub-chassis. Rotating the one or more first lever arms away from the chassis applies a force through each corresponding second lever arm and camming feature to the sub-chassis to disconnect the sub-chassis from the chassis.

In one embodiment, the camming features engage the sub-chassis for a portion of movement of the first lever arm and allow movement of the sub-chassis without further movement of the first lever arm when the first lever arm is in a final position. In another embodiment, the camming features include a channel and a protrusion that fits in the channel. The channel is shaped so that the protrusion applies a force to a wall of the channel to apply the force to disconnect the sub-chassis during movement of the first lever arm. The channel is also shaped to allow the sub-chassis to move without further movement of the first lever arm when the first lever arm is in a final position. In one embodiment, the protrusion is coupled to the second lever arm and the channel is in the sub-chassis.

In one embodiment, the first lever arms include two first lever arms disposed on each side of the first end of the chassis and one or more connecting members disposed between the two first lever arms and connected to the two first lever arms. In another embodiment, each first lever arm includes a guide wall. The guide wall is connected to an edge portion of the first lever arm and extends in a direction substantially planar to sides of the sub-chassis. The guide wall of each lever arm limits movement of the sub-chassis after each first lever arm is in a final position to a desired direction. In one embodiment, each first lever arm includes a hard stop on each first lever arm located distal to the pivot of the first lever arm. The hard stop is positioned to inhibit movement of the sub-chassis along the one or more first lever arms beyond the hard stop. In one embodiment, the apparatus also includes one or more support links. Each support link is coupled to the multifunction shelf and the chassis. Each support link includes a stop that prevents each first lever arm from rotating beyond a final position. The support links provide support such that the one or more first lever arms support a weight of the sub-chassis.

In one embodiment, each first lever arm includes a slide surface and the final position of the one or more first lever arms includes a position where the one or more slide surfaces of the one or more first lever arms are substantially planar with a bottom of the sub-chassis such that as the sub-chassis moves away from the chassis. The sub-chassis slides along the slide surface of each first lever arm. In another embodiment, each support link for a first lever arm includes a first bar coupled to the second lever arm that is connected to the first lever arm. A second bar is coupled to the chassis, and a pivot connects the first bar and the second bar. In another embodiment, each support link for a first lever arm includes a curved bar connected to the first lever arm and a stop piece connected to the chassis that stops movement of the support link and the first lever arm in response to the first lever arm rotating away from the chassis to a final position.

In one embodiment, each first lever arms comprises a retention feature that connects the first lever arm to the chassis after the first lever arm is in a position adjacent to the chassis. The retention feature provides support in limiting the movement of the sub-chassis away from the chassis. In another embodiment, the multifunction shelf includes one or more support frames and each support frame is connected to the first end of the chassis. Each support frame couples to one or more pivot points and each support frame includes one or more support links coupled to the multifunction shelf. Each support link includes a stop that prevents the one or more first lever arms from rotating beyond a final position. The stop engages the support frame at the final position.

In one embodiment, the one or more first lever arms include one or more bezel retention features. Each bezel retention feature includes a receiving area that receives a connection portion of a bezel. In another embodiment, each first lever arm includes one or more arm extensions. Each arm extension lengthens the first lever arm connected to the arm extension. In one embodiment, rotating the first lever arms toward the chassis applies a force through each corresponding second lever arm and camming feature to the sub-chassis to connect the sub-chassis to the chassis. In another embodiment, rotating the one or more first lever arms away from the chassis moves the sub-chassis away from the chassis. In another embodiment, each second lever arm connected to a first lever arm extends in a direction perpendicular to the connected first lever arm.

A system for a multifunction camming support shelf is disclosed. The system includes a chassis sized for a computer rack and to hold one or more electronic components. The system includes a sub-chassis mounted in a first end of the chassis. The sub-chassis is connected to one or more connectors within the chassis. The system includes a multifunction shelf rotatably coupled to the chassis at one or more pivot points. The multifunction shelf includes one or more first lever arms. Each lever arm extends away from a pivot point of the one or more pivot points. The multifunction shelf includes one or more second lever arms. Each second lever arm is connected to a first lever arm and extends in a direction at a first angle to the connected first lever arm. The multifunction shelf includes one or more camming features. Each camming feature is coupled to a second lever arm and the sub-chassis. Rotating the one or more first lever arms away from the chassis applies a force through each corresponding second lever arm and camming feature to the sub-chassis to disconnect the sub-chassis from the chassis.

Another apparatus for a multifunction camming support shelf is disclosed. The apparatus includes a multifunction shelf rotatably coupled to a chassis at one or more pivot points. The chassis is sized for a computer rack and to hold one or more electronic components. The chassis includes a sub-chassis mounted in a first end of the chassis. The sub-chassis is connected to one or more connectors within the chassis. The multifunction shelf includes two first lever arms. One first lever arm disposed on each side of the first end of the chassis. Each lever arm extends away from a pivot point of the one or more pivot points. Each first lever arm includes a hard stop located distal to the pivot of the first lever arm. The hard stop is positioned to inhibit movement of the sub-chassis along the one or more first lever arms beyond the hard stop. Each first lever arm also includes a guide wall connected to an edge portion of the first lever arm and extending in a direction substantially planar to sides of the sub-chassis. The guide wall of each lever arm limits movement of the sub-chassis after each first lever arm is in a final position to a desired direction.

Each first lever arm also includes a support link. The support link is coupled to the multifunction shelf and the chassis. The support link includes a stop that prevents the first lever arm from rotating beyond a final position and provides support such that the two first lever arms support a weight of the sub-chassis. The multifunction shelf also includes two second lever arms. Each second lever arm is connected to a first lever arm and extends in a direction perpendicular to the connected first lever arm. The multifunction shelf also includes two camming features. Each camming feature is coupled to a second lever arm and the sub-chassis. Rotating the first lever arms away from the chassis applies a force through each corresponding second lever arm and camming feature to the sub-chassis to disconnect the sub-chassis from the chassis.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which:

FIG. 6A is a cutaway side view illustrating one embodiment of a multifunction camming support shelf in a partially opened position;

FIG. 6B is a cutaway side view illustrating one embodiment of a multifunction camming support shelf in an open position;

FIG. 7A is a cutaway side view illustrating one embodiment of a multifunction camming support shelf in a partially opened position;

FIG. 7B is a cutaway side view illustrating one embodiment of a multifunction camming support shelf in an open position; and

DETAILED DESCRIPTION

Figure 1:
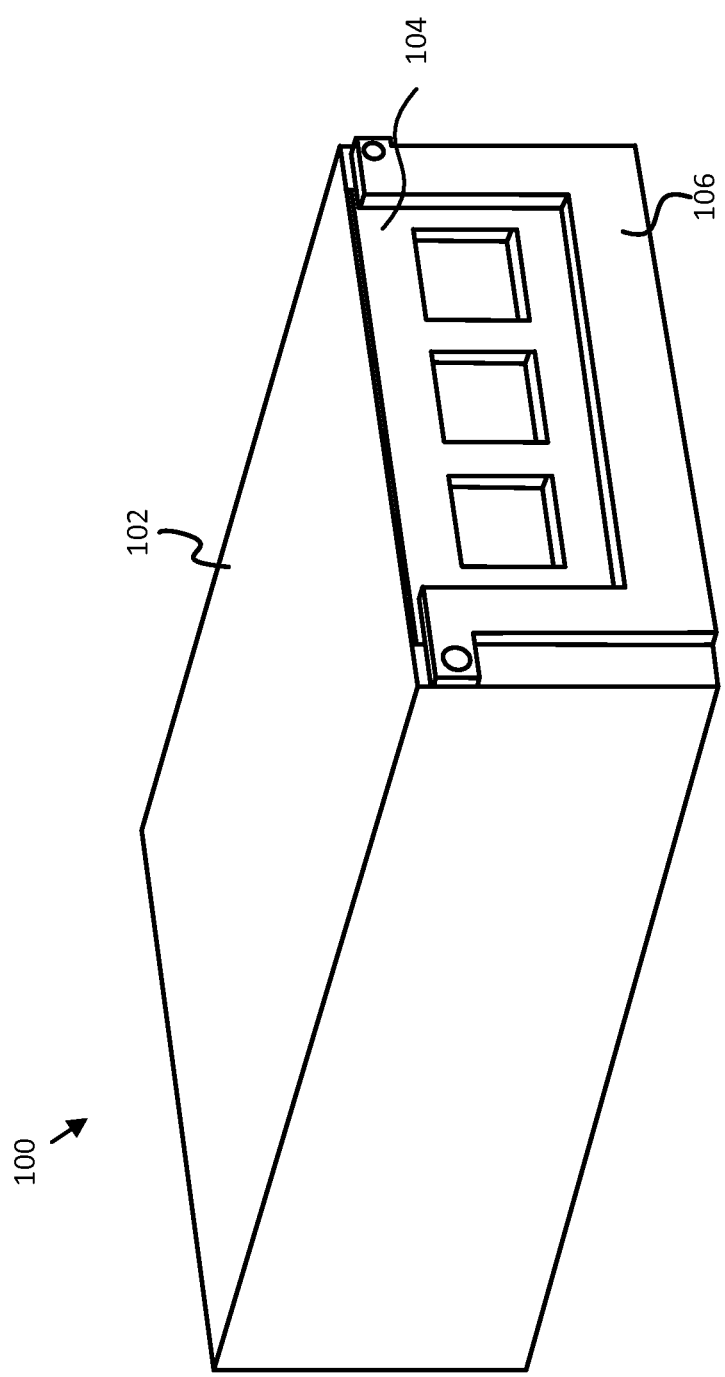
FIG. 1 is a perspective view illustrating one embodiment of a multifunction camming support shelf.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system."

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, and systems according to embodiments. The schematic flowchart diagrams and/or schematic block diagrams in the Figures illustrate the architecture, functionality, and operation of possible implementations of apparatuses, systems, and methods according to various embodiments.

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

FIG. 1 depicts one embodiment of a system 100 for multifunction camming support shelf. The system 100 includes a chassis 102, a sub-chassis 104, and a multifunction shelf 106, which are described below.

In one embodiment, the system 100 includes a chassis 102. In one embodiment, the chassis 102 may include a container that holds one or more electronic components. The chassis 102 may be sized for a computer rack and may be sized to hold the one or more electronic components. The chassis 102 may be mounted to a server rack, which may include 19-inch racks, 23-inch racks, and the like. The chassis 102 may be any size that fits in a computer rack, including 1 U (one rack unit), 2 U (two rack units), 4 U, or the like. The chassis 102 may include one or more interfaces for mounting to a computer rack. The one or more interfaces may include side plates with screws that screw into the sides of the computer rack, or the like. The chassis 102 may include one or more ends. The one or more ends may include one or more openings where electronic components, cables, or the like may be inserted through the end and connect with the one or more electronic components inside the chassis 102. Additionally or alternatively, the one or more ends may include one or more coverings for protecting the electronic components inside of the chassis 102.

In one embodiment, the chassis 102 includes a sub-chassis 104 mounted in a first end of the chassis 102. The sub-chassis 104 may be connected to one or more connectors within the chassis 102. The sub-chassis 104 may hold one or more electronic components. For example, the sub-chassis 104 may include a power supply that receives electric power or some other type of power from a power source and the sub-chassis 104 may deliver that power to the one or more electronic components within the chassis 102. Additionally or alternatively, the sub-chassis 104 may include a node interconnect device that assists one or more computer nodes of the chassis 102 in communicating with or delivering data to each other or other computing devices. Furthermore, the sub-chassis 104 may be heavy and weigh over 50 pounds (22 kilograms).

The system 100 may include a multifunction shelf 106. The multifunction shelf 106 may mount to one or more sides of an end of the chassis 102. The multifunction shelf 106 may rotatably couple to the chassis 102. The multifunction shelf 106 may cover, wholly or partially, the sub-chassis 104 and prevent the sub-chassis 104 from moving away from the chassis 102 while the multifunction shelf 106 is in a substantially upright position, as shown in FIG. 1. The multifunction shelf 106 is discussed below.

Figure 2:
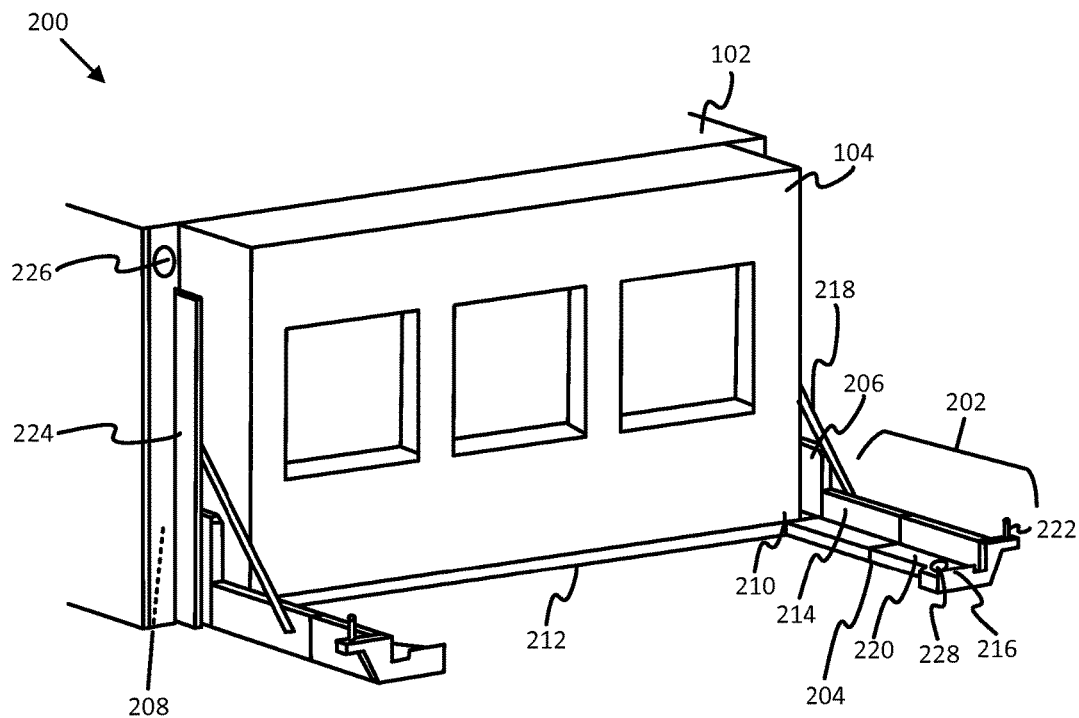
FIG. 2 is a perspective view illustrating one embodiment of a multifunction camming support shelf.

FIG. 2 depicts one embodiment of an apparatus 200 for a multifunction camming support shelf. The apparatus 200 includes a multifunction shelf 106. The multifunction shelf 106 includes one or more first lever arms 202, one or more second lever arms 206, and one or more camming features 208, and one or more pivot points 210, which are described below.

In one embodiment, the multifunction shelf 106 includes one or more first lever arms 202. Each first lever arm 202 may extend away from a pivot point 210. A first lever arm 202 may extend away from a pivot point 210 in a variety of ways. For example, in one embodiment, the first lever arm 202 may include one or more pieces of a rigid material of substantially the same length as the height of the sub-chassis 104, as shown in FIG. 2. Rigid material, as described herein, may include a material that substantially retains its shape when a forced is applied. Substantially retaining its shape, as used herein, includes maintaining shape when a force is applied and includes minor deflection or deformation when a force is applied while retaining functionality. In one embodiment, the length of the one or more first lever arms 202 may be more or less than the length of the sub-chassis 104. In another embodiment, the length of one or more of the one or more first lever arms 202 may be different lengths than the other first lever arms 202.

In one embodiment, the first lever arm 202 may include one or more arm extensions 204 that may lengthen the first lever arm 202 connected to the one or more arm extensions 204. The one or more arm extensions 204 may lengthen the first lever arm 202 in a variety of ways. For example, in one embodiment, an arm extension 204 may include one or more pieces of a rigid material that initially recede into the first lever arm 202. The one or more arm extensions 204 may lengthen the first lever arm 202 by extending out of the first lever arm 202. By lengthening the one or more first lever arms 202, the one or more arm extensions 204 may facilitate the installation and removal of multiple sub-chassis 104 of different lengths into and from the chassis 102.

In one embodiment, the multifunction shelf 106 may include one or more second lever arms 206 connected to a first lever arm 202 and extending in a direction at a first angle to the connected first lever arm 202. The second lever arm 206 may rigidly connect to the first lever arm 202 such that a force is applied to the one or more first lever arms 202 may move the first lever arm 202 in unison with the second lever arm 206. In one embodiment, the second lever arm 206 may connect to the first lever arm 202 such that when the multifunction shelf 106 is in a closed position, the one or more second lever arms 206 substantially recede between the chassis 102 and the sub-chassis 104.

In one embodiment, the second lever arm 206 may extend in a direction at a first angle to the connected first lever arm 202 in a variety of ways. For example, in one embodiment, the second lever arm 206 may include a rigid material. The rigid material may include the same material of the first lever arm 202 or may include a different material than the material of the first lever arm 202. The second lever arm 206 may extend in a direction at an angle to the connected first lever arm 202. For example, as shown in FIG. 2, in one embodiment, a second lever arm 206 may extend in a direction perpendicular to the connected first lever arm 202. In another embodiment, the second lever arm 206 may extend at an acute angle from the first lever arm 202. In yet another embodiment, the second lever arm 206 may extend at an obtuse angle from the first lever arm 202.

In one embodiment, the second lever arm 206 extends in a direction at an angle to the corresponding first lever arm 202 to engage with the one or more camming features 208 described below. The second lever arm 206 engaging with the camming feature 208 may allow a force to be applied through each corresponding second lever arm 206 and camming feature 208 to the sub-chassis 104 to disconnect the sub-chassis 104 from the chassis 102. The angle at which the second lever arm 206 extends may determine where the second lever arm 206 applies through a camming feature 208 and to the sub-chassis 104. Additionally or alternatively, the angle at which the second lever arm 206 extends may determine the amount of force the second lever arm 206 applies through the camming feature 208 and to the sub-chassis 104.

In one embodiment, the multifunction shelf 106 may include one or more camming features 208 coupled to a second lever arm 206 and the sub-chassis 104. Rotating the one or more first lever arms 202 away from the chassis 102 applies a force through each corresponding second lever arm 206 and camming feature 208 to the sub-chassis 104 to disconnect the sub-chassis 104 from the chassis 102. The term "camming," as used herein, may include translating a circular, curved, rotary, or the like motion into a linear motion. Additionally or alternatively, the term "camming" may include translating a linear motion into a circular, curved, rotary, or the like motion. For example, as mentioned above, rotating the one or more first lever arms away from the chassis 102 (a rotary motion) applies a force through each corresponding second lever arm 206 and camming feature 208 to the sub-chassis 104 to disconnect the sub-chassis 104 (a substantially linear motion) from the chassis 102.

In one embodiment, the one or more camming features 208 engages the sub-chassis 104 for a portion of movement of the first lever arm 202 and allow movement of the sub-chassis 104 without further movement of the first lever arm 202 when the first lever arm 202 is in a final position.

In another embodiment, the one or more camming features 208 include a channel and a protrusion that fits in the channel. The channel is shaped so that the protrusion applies a force to a wall of the channel to apply the force to disconnect the sub-chassis 104 during movement of the first lever arm 202. The channel is shaped to allow the sub-chassis 104 to move without further movement of the first lever arm 202 when the first lever arm 202 is in a final position. In one embodiment, the protrusion may couple to the second lever arm 206 and the channel may be in the sub-chassis 104.

Figure 3A:
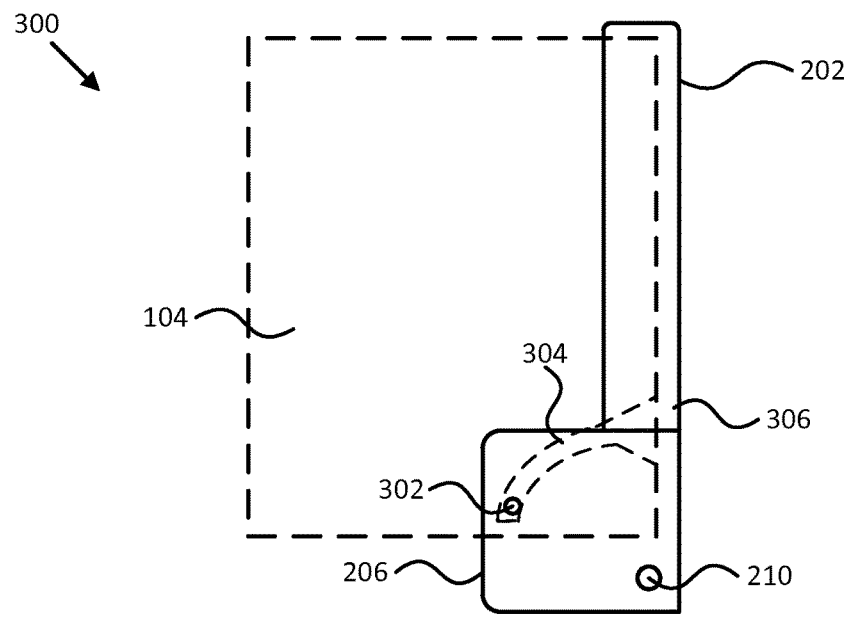
FIG. 3A is a cutaway side view illustrating one embodiment of a multifunction camming support shelf in a closed position.

FIG. 3A depicts one embodiment an apparatus 300 for a multifunction camming support shelf. The apparatus 300 may include a camming feature 208. The camming feature 208 may include a protrusion 302 mounted on a second lever arm 206. The camming feature 208 may also include a channel 304 connected to the sub-chassis 104. The protrusion 302 may be of any length or width sufficient to extend from the second lever arm 206 into the channel 304. The channel 304 may be curved, straight, a series of channels of that are a combination of straight channels and curved channels, or any other shape so that the protrusion 302 applies a force to a wall of the channel 304 to apply a force to disconnect the sub-chassis 104 from the chassis 102. The sub-chassis 104 may connect to the chassis 102 and a high amount of force may be needed to disconnect the sub-chassis 104 from the chassis 102.

Figure 3B:
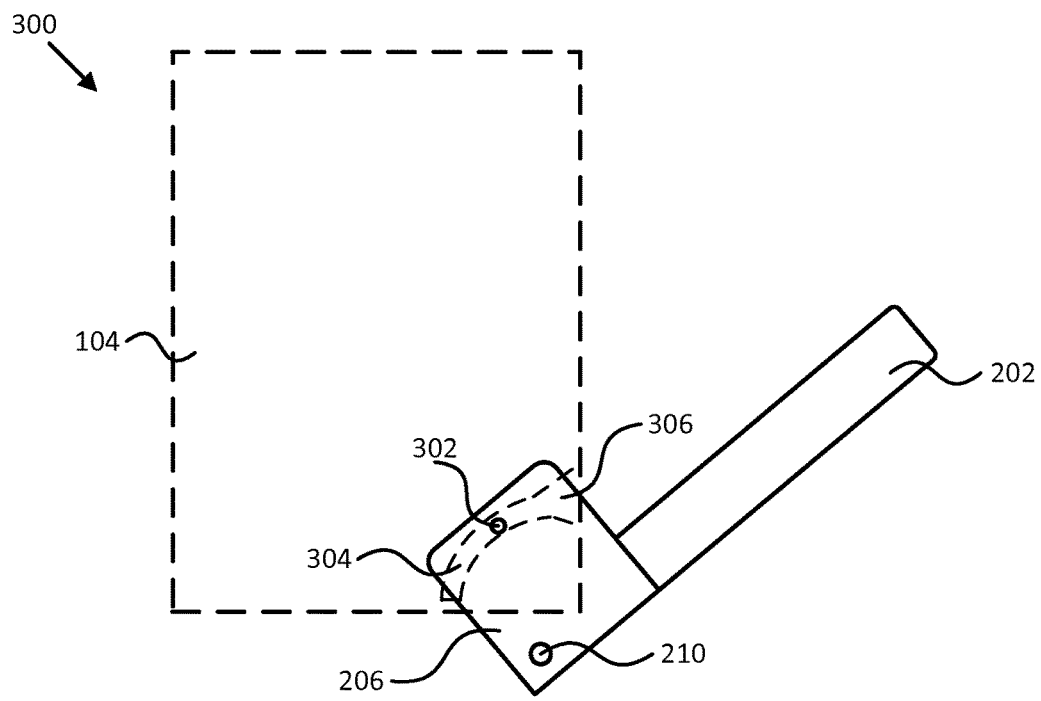
FIG. 3B is a cutaway side view illustrating one embodiment of a multifunction camming support shelf in a partially open position.

As depicted in FIG. 3B, in one embodiment, a user may begin rotating the one or more first lever arms 202 away from the first end of the chassis 102. The rotation may apply a force through each corresponding second lever arm 206 and camming feature 208 to the sub-chassis 104. The rotation may move the protrusion 302 of the second lever arm 206 against the channel 304 of the sub-chassis 104, applying the force through the channel 304 of the camming feature 208 to the sub-chassis 104.

Figure 3C:
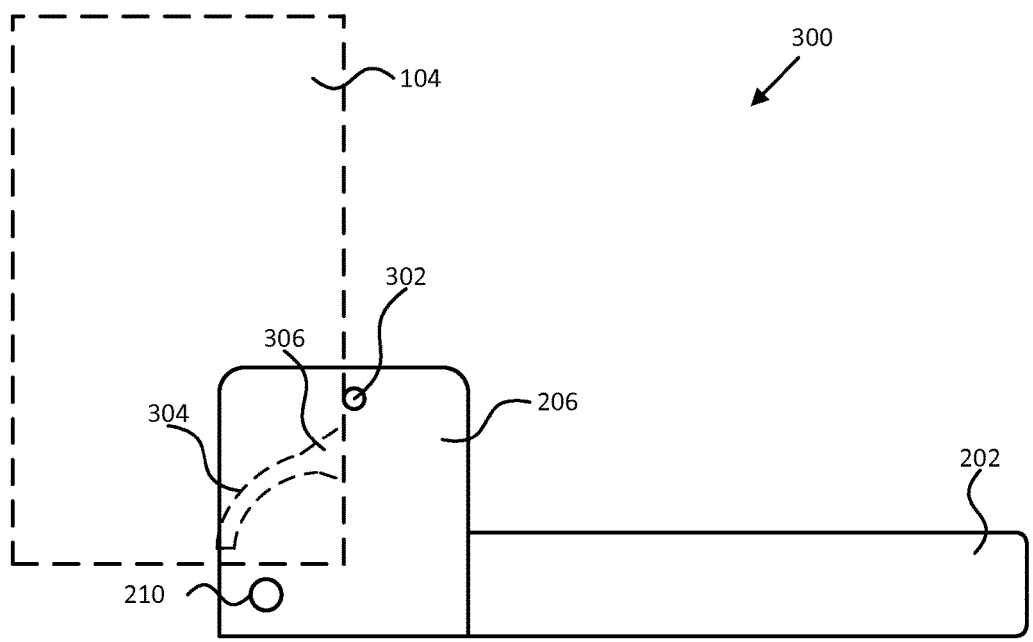
FIG. 3C is a cutaway side view illustrating one embodiment of a multifunction camming support shelf in an open position.

As depicted in FIG. 3C, in one embodiment, a user may rotate the one or more first lever arms 202 into a final position where the one or more first lever arms 202 are substantially planar to the bottom of the sub-chassis 104. The protrusion 302 of the camming feature 208 may exit the channel 304 and a lead-in opening 306. The sub-chassis 104 may disconnect from the chassis 102. The camming feature 208 may assist a user in disconnecting the sub-chassis 104 from the chassis 102 because rotating the one or more first lever arms 202 into a final position may require less force from a user than a user pulling on the sub-chassis 104.

Figure 3D:
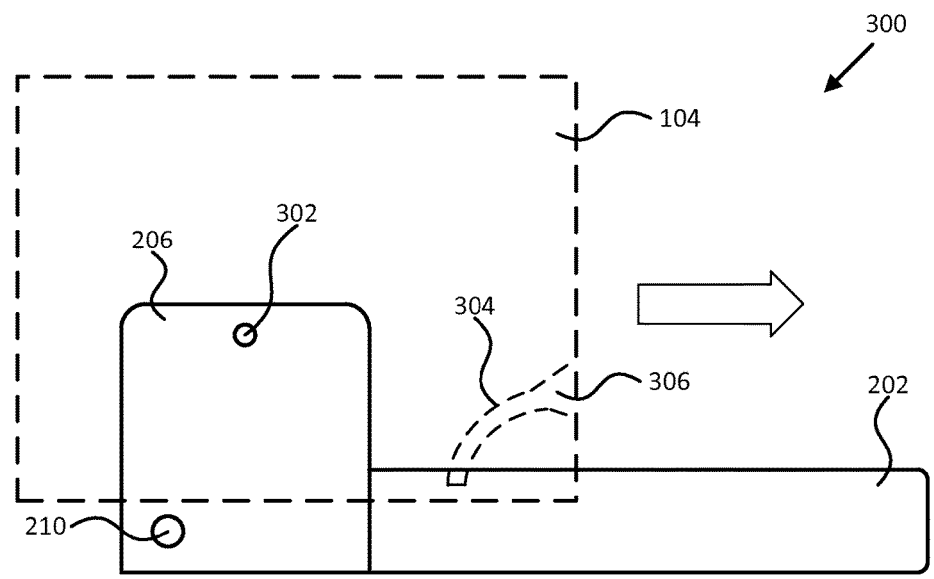
FIG. 3D is a cutaway side view illustrating one embodiment of a multifunction camming support shelf in an open position.

As depicted in FIG. 3D, in one embodiment, the protrusion 302 of the camming feature 208 may exit the channel 304 and lead-in opening 306 and move into a position where the protrusion 302 does not engage the sub-chassis 104, the channel 304, or lead-in opening 306. A user may move the sub-chassis 104 away from the chassis 102 without the protrusion engaging with the channel 304, lead-in opening 306 or the sub-chassis 104. Furthermore, the user may move the sub-chassis 104 without further movement of the first lever arm 202. While the channel 304 and a lead-in opening 306 are depicted on one or more first lever arms 202 and the protrusion 302 is depicted and described as being on the sub-chassis 104, one of skill in the art will recognize other embodiments, such as a channel 304 and possibly a lead-in opening 306 on the sub-chassis 104 and a protrusion 302 on the one or more first lever arms 202.

One of skill in the art will recognize that the apparatus 300 may be used to disengage the sub-chassis 104 from the chassis 102 or to install and engage the sub-chassis 104 to the chassis 102. For example, in one embodiment, the sub-chassis 104 may initially rest on the one or more first lever arms 202 while the first lever arms 202 are in the final position as depicted in FIG. 3D. In a further embodiment, installing the sub-chassis 104 may include a user moving the sub-chassis 104 toward the chassis 102, for example until the sub-chassis 104 engages the chassis 102.

In one embodiment, the channel may include a lead in opening 306. The lead in opening 306 may include an opening that tapers from a first end of the lead in opening 306 to a second end of the lead in opening 306. In one embodiment, the narrow end of the lead in opening 306 may couple to an end of the channel 304 and the wide end of the lead in opening 306 may face away from the chassis 102, as depicted in FIGS. 3A-3D. The user may rotate the one or more first lever arms 202 upward so that the protrusions 302 engage the lead in opening 306. In one embodiment, the protrusion 302 engaging with the lead in opening 306 may include the protrusion 302 entering the lead in opening 306.

The lead in opening 306, in one embodiment, may guide the protrusion 302 into the channel 304 in response to a user rotating the one or more first lever arms 202 upward, as depicted in FIG. 3B. The user may apply pressure to the one or more first lever arms 202, which transfers force through the second lever arm 206 connected to each first lever arm 202, and the protrusion 302 of each first lever arm 202 then applies a force to the channel 304 to push the sub-chassis 104 into connectors on the chassis 102, as depicted in FIG. 3A. A user applying force to the first lever arms 202 may apply more force to engage the sub-chassis 104 to the chassis 102 than the user applying a same amount of force directly to the sub-chassis 104. Thus, the apparatus 300 may be used to disengage a sub-chassis 104 from a chassis 102 or to engage the sub-chassis 104 with the chassis 102.

In one embodiment, a camming feature 208 may include one or more camming arms. The one or more camming arms may connect to the one or more first lever arms 202 or the one or more second lever arms 206. For example, a camming arm may include a blade server handle. The one or more camming arms may include two or more prongs. The prongs may be positioned on the camming arm to engage with the sub-chassis 104 for different movements of the multifunction shelf 106. For example, in one embodiment, rotating the multifunction shelf 106 away from the chassis 102 may cause one prong of the two or more prongs to engage with the sub-chassis 104 and rotating the multifunction shelf 106 toward the chassis 102 may cause a different prong of the two or more prongs to engage with the sub-chassis 104. The two or more prongs of the camming arm may engage with one or more protrusions connected to the sub-chassis 104.

It should not be understood that the one or more camming features 208 are limited to the embodiments depicted in FIGS. 3A, 3B, 3C, and 3D. One of skill in the art will recognize other ways that the one or more camming features 208 may engage the sub-chassis 104 for a portion of movement of the first lever arm 202 and allow movement of the sub-chassis 104 without further movement of the first lever arm 202 when the first lever arm 202 is in a final position. Furthermore, in one embodiment, a portion of each camming feature 208 of the one or more camming features 208 may bolt to the sub-chassis 104. In another embodiment, a portion of each camming feature 208 of the one or more camming features 208 may be built into the sub-chassis 104. For example, in one embodiment, the channel 304 may be added to the sub-chassis or bolt to the sub-chassis 104. In another embodiment, the channel 304 may be built into the sub-chassis 104. In one embodiment, as described above, the protrusion 302 of the camming feature 208 may mount to the second lever arm 206 and the channel 304 of the camming feature 208 may connect to the sub-chassis 104. In another embodiment, the protrusion 302 of the camming feature 208 may mount to the sub-chassis 104 and the channel 304 of the camming feature 208 may connect to the second lever arm 206.

Figure 4A:
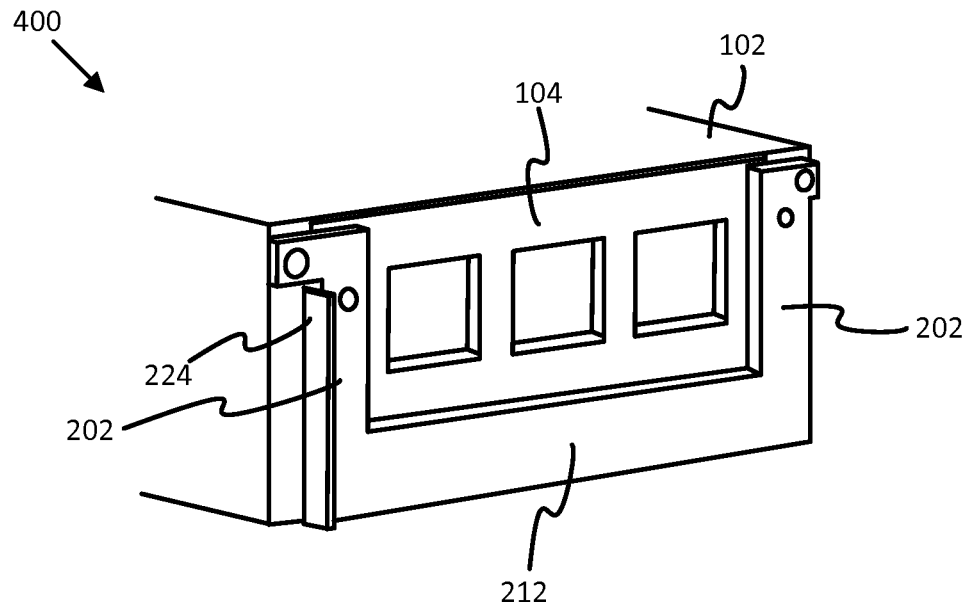
FIG. 4A is a perspective view illustrating one embodiment of a multifunction camming support shelf in a closed position.

FIGS. 4A-D are perspective views illustrating one embodiment of an apparatus 400 for a multifunction shelf 106, a chassis 102 and a sub-chassis 104 in various positions. FIG. 4A depicts a multifunction shelf 106 in a closed position retaining the sub-chassis 104 in the chassis 102. For example, the multifunction shelf 106 may initially be in a closed position with the one or more first lever arms 202 adjacent to and substantially planar to the sides of the first end of the chassis 102. The multifunction shelf 106 may retain the sub-chassis 104 in the chassis 102 in a variety of ways. For example, as depicted in FIG. 4A, in one embodiment, a portion of the one or more first lever arms 202 may cover a portion of the sub-chassis 104. In one embodiment, the one or more first lever arms 202 may connect to the one or more sides of the first end of the chassis 102. In another embodiment, the one or more first lever arms may include one or more retention features 222 that may connect to one or more support frames 224, as described below. As depicted in FIG. 4A, rotating the one or more first lever arms 202 away from the chassis 102 applies a force through each corresponding second lever arm 206 and camming feature 208 to the sub-chassis 104 to disconnect the sub-chassis 104 from the chassis 102.

Figure 4B:
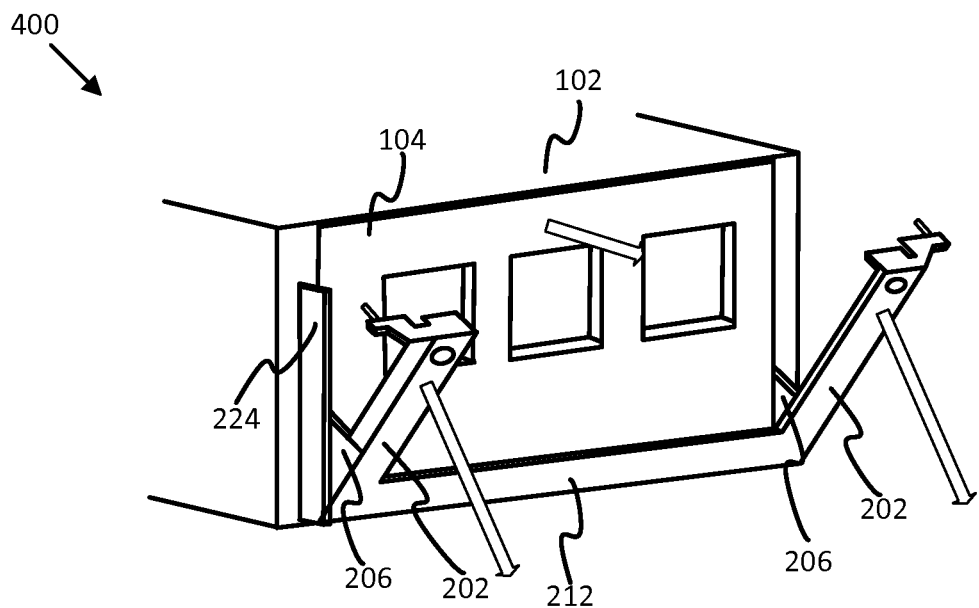
FIG. 4B is a perspective view illustration one embodiment of a multifunction camming support shelf in a partially opened position.

FIG. 4B depicts the multifunction shelf 106 in an opening position and rotating away from the chassis 102. As depicted in FIG. 4B, a user may begin rotating the one or more first lever arms 202 away from the first end of the chassis 102. The rotation applies a force through each corresponding second lever arm 206 and camming feature 208 to the sub-chassis 104. The force disconnects the sub-chassis 104 from the chassis 102 and moves the sub-chassis 104 away from the chassis 102.

Figure 4C:
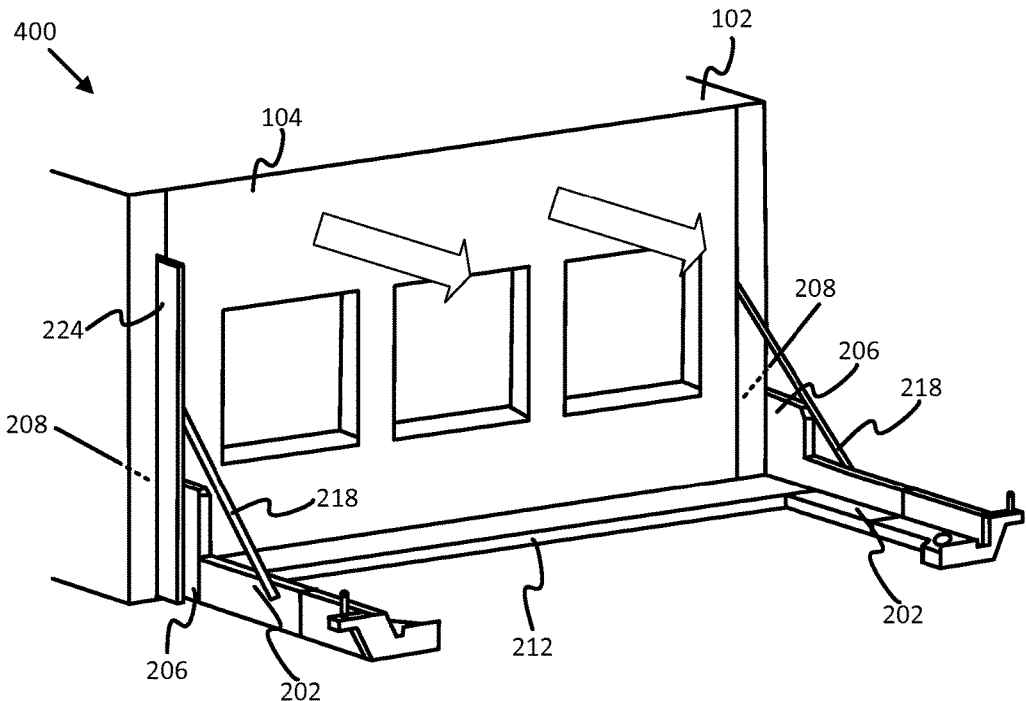
FIG. 4C is a perspective view illustration one embodiment of a multifunction camming support shelf in an open position.
Figure 4D:
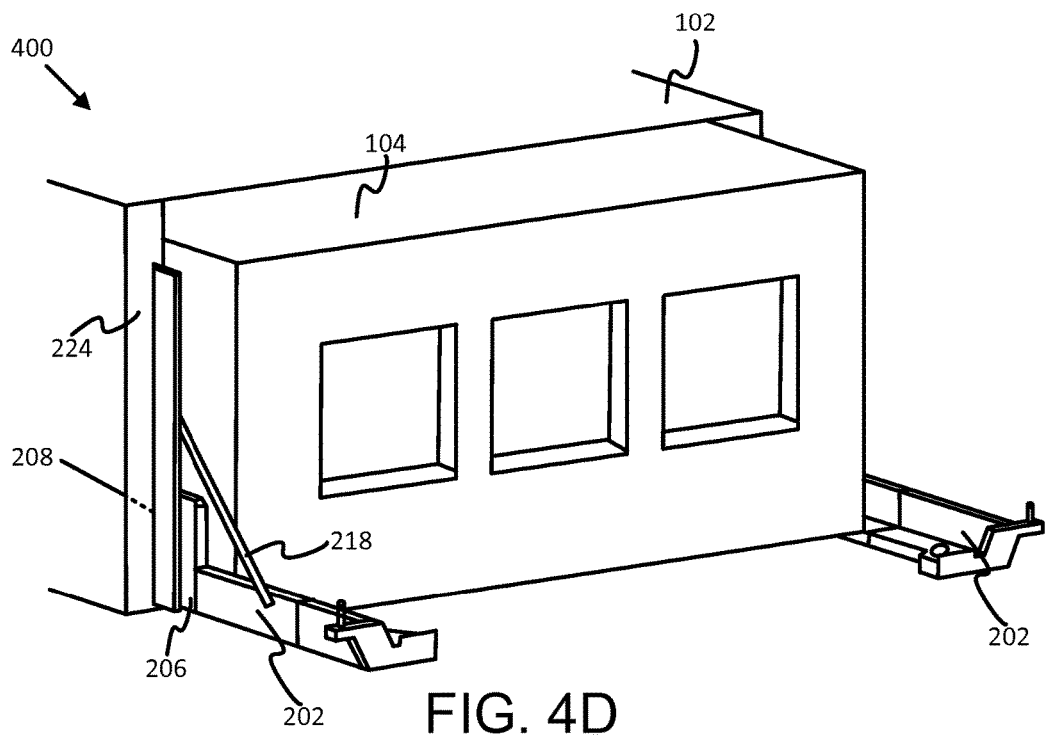
FIG. 4D is a perspective view illustration one embodiment of a multifunction camming support shelf in an open position.

FIG. 4C depicts the multifunction shelf 106 in a final position. As depicted in FIG. 4C, the rotation of the one or more first lever arms 202 may move the one or more first lever arms 202 into a final position that is substantially planar to the bottom of the first end of the chassis 102. In the final position, the sub-chassis 104 may be moved enough so that the sub-chassis 104 is disconnected from the chassis 102. In one embodiment, with the sub-chassis 104 disconnected from the chassis 102, and with the one or more first lever arms 202 in a final position that is substantially planar to the bottom of the first end of the chassis 102, the sub-chassis 104 may be ready for a user to slide the sub-chassis 104 away from the chassis 102. The first lever arms 202, as depicted, form channels for sliding and guiding the sub-chassis 104. FIG. 4D depicts the multifunction shelf 106 in a final position and the sub-chassis 104 moving away from the chassis 102. As depicted in FIG. 4D, a user may slide the sub-chassis 104 away from the chassis 102. The multifunction shelf 106 may support the weight of the sub-chassis 104. The multifunction shelf 106 may also prevent the sub-chassis 104 from moving side to side or off of the multifunction shelf 106 until the user is ready to support the weight of the sub-chassis 104.

Returning to FIG. 2, in one embodiment, the multifunction shelf 106 includes one or more pivot points 210 where the multifunction shelf 106 rotatably couples to the chassis 102. The multifunction shelf 106 may rotatably couple to the chassis 102 in a variety of ways. For example, in one embodiment, the multifunction shelf 106 may include one or more protrusions that may insert into one or more pivot apertures of the side of the first end of the chassis 102 to form the pivot points 210. The one or more pivot apertures may be on the bottom of the side of the first end of the chassis 102. One of skill in the art will recognize other ways that the multifunction shelf 106 may rotatably couple to the chassis 102.

In one embodiment, the one or more first lever arms 202 may include two first lever arms 202 disposed on each side of the first end of the chassis 102, as depicted in FIG. 2. In another embodiment, the two first lever arms 202 may independently rotatably couple to a first end of the chassis 102 without connecting to each other. In another embodiment, the one or more first lever arms 202 may include two first lever arms 202 disposed on each side of the first end of the chassis 102 with one or more connecting members 212 disposed between the two first lever arms 202 and connected to the two first lever arms 202 so that the first lever arms 202 rotate together.

In one embodiment, the multifunction shelf 106 may include one or more connecting members 212 disposed between the one or more first lever arms 202 and connected to the one or more first lever arms 202. The one or more connecting members 212 may include a rigid material. A connecting member 212, in one embodiment, connects two or more first lever arms 202 to couple the first lever arms 202 so that the first lever arms 202 move in unison. In another embodiment, the one or more connecting members 212 may prevent the sub-chassis 104 from moving away from the chassis 102 when the one or more first lever arms 202 are not in a position substantially planar to the sides of the first end of the chassis 102. Furthermore, the one or more connecting members 212 may support the one or more first lever arms 202 and prevent the one or more first lever arms 202 from bending, warping, or otherwise losing their shape. In another embodiment, the one or more connecting members 212 may support the weight of the sub-chassis 104 when the one or more first lever arms are in a position substantially planar to the sides of the first end of the chassis 102 and the sub-chassis 104 move away from the chassis 102.

In one embodiment, the one or more connecting members 212 may be disposed between the one or more first lever arms 202 near the one or more pivot points 210. In another embodiment, the one or more connecting members 212 may be disposed between the one or more first lever arms 202 distal to the one or more pivot points 210. In another embodiment, the one or more connecting members 212 may be disposed between the one or more first lever arms 202 in various locations between the pivot points 210 and a position distal to the pivot points 210. In one embodiment, the one or more connecting members 212 may be disposed between the one or more first lever arms 202 at an angle substantially perpendicular to the one or more first lever arms 202. In another embodiment, the one or more connecting members 212 may be disposed between the one or more first lever arms 202 at one or more angles to the two first lever arms 202.

In one embodiment, a first lever arm 202 includes a guide wall 214 that connects to an edge portion of the first lever arm 202. In another embodiment, the guide wall 214 extends in a direction substantially planar to sides of the sub-chassis 104, as depicted in FIG. 2. The guide wall 214 may limit movement of the sub-chassis 104 after each first lever arm 202 is in a final position to a desired direction. For example, as shown in FIG. 2, the guide wall 214 may extend in a direction perpendicular to the connected first lever arm 202 (and planar to sides of the sub-chassis 104) to limit the movement of the sub-chassis 104 and prevent the sub-chassis 104 from moving to one side of the chassis 102.

The first lever arm 202 may include a guide wall 214 in a variety of ways. For example, in one embodiment, the guide wall 214 may include a removable piece of rigid material connected to the first lever arm 202. The rigid material may include the same material as the first lever arm 202 or may include a different material. The guide wall 214 may prevent movement of the sub-chassis 104 to the side of the chassis 102 and may keep the sub-chassis 104 on the one or more first lever arms 202. In another embodiment, the guide wall 214 decouples from the first lever arm 202 to allow a user to slide the sub-chassis 104 off of the multifunction shelf 106 in response to the user being ready to remove the sub-chassis 104 and support the weight of the sub-chassis 104. In another embodiment, the guide wall 214 may include a piece of material rotatably coupled to the first lever arm 202. A user may rotate the guide wall 214 away from the first lever arm 202 so that the guide wall 214 is substantially planar with the first lever arm 202. Additionally or alternatively, a user may rotate the guide wall 214 toward the first lever arm so the guide wall 214 fits within and is substantially planar to the first lever arm 202 or fits adjacent to the first lever arm 202.

In yet another embodiment, the guide wall 214 may retract downward into the first lever arm 202. One of skill in the art will recognize other ways to move or remove the guide wall 214 from the first lever arm 202. In another embodiment, the guide wall 214 may be substantially immovable in relation to the first lever arm 202. For example, the guide wall 214 may retract into slots on the sides of the sub-chassis 104 when the first lever arms 202 are positioned against the sub-assembly 202. The guide wall 214 may include a rigid material of any height to limit the movement of the sub-chassis 104.

In one embodiment, the first lever arm 202 may include a hard stop 216 located distal to the pivot point 210 of the first lever arm 202. The hard stop 216 is located on a side of the first lever arm 202 so that movement of the sub-chassis 104 is inhibited from moving past the hard stop 216. The hard stop 216 may include a stub positioned to inhibit movement of the sub-chassis 104 along the one or more first lever arms 202 beyond the hard stop 216. For example, as shown in FIG. 2, the hard stop 216 may extend in a direction perpendicular to the first lever arm 202 to inhibit the movement of the sub-chassis 104 away from the first end of the chassis 102 beyond the hard stop 216.

The first lever arm 202 may include the hard stop 216 in a variety of ways. For example, in one embodiment, the hard stop 216 may include a removable stub from the connected first lever arm 202. The hard stop 216 may decouple from the first lever arm 202 to allow a user to slide the sub-chassis 104 off the multifunction shelf 106 in response to the user being ready to remove the sub-chassis 104 and support the weight of the sub-chassis 104. In another embodiment, the hard stop 216 may be rotatably coupled to the first lever arm 202. A user may rotate the hard stop 216 away from the first lever arm 202 so the hard stop 216 is substantially planar with the first lever arm 202. Additionally or alternatively, a user may rotate the hard stop 216 toward the first lever arm so the hard stop 216 fits within and is substantially planar to the first lever arm 202. In yet another embodiment, the hard stop 216 may retract downward into the first lever arm 202. One of skill in the art will recognize other ways to move or remove the hard stop 216 from the first lever arm 202.

Figure 5:
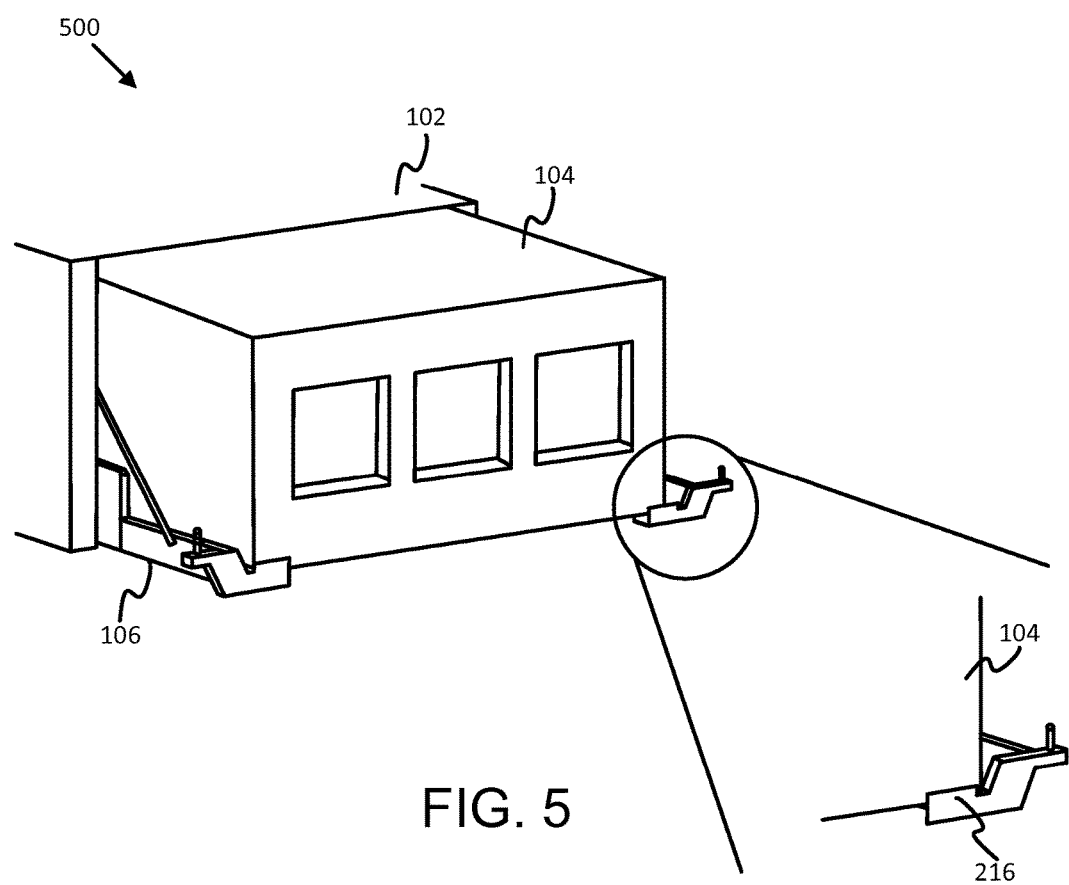
FIG. 5 is a perspective view illustrating one embodiment of a multifunction camming support shelf.

In one embodiment, the hard stop 216 may be substantially immovable in relation to the first lever arm 202. The hard stop 216 may be of any height to limit the movement of the sub-chassis 104. Additionally, the height of the hard stop 216 may allow a user removing the sub-chassis 104 from the chassis 102 to lift the sub-chassis 104 over the hard stop 216. For example, FIG. 5 depicts one embodiment of an apparatus 500 for a multifunction camming support shelf. As depicted in FIG. 5, in one embodiment, with the one or more first lever arms 202 in a position substantially planar to the bottom of the first end of the chassis 102, a user may move the sub-chassis 104 away from the chassis 102. The user may move the sub-chassis 104 away from the chassis 102 until the sub-chassis 104 engages the one or more hard stops 216. The one or more hard stops 216 may inhibit further movement of the sub-chassis 104 away from the chassis 102 without lifting the sub-chassis 104 above the hard stop 216. A user may lift the sub-chassis 104 over the one or more hard stops 216 and off of the multifunction shelf 106.

Returning to FIG. 2, in one embodiment, the apparatus 200 may include one or more support links 218. Each support link 218 may couple to the multifunction shelf 106 and the chassis 102 and may include a stop that prevents each first lever arm 202 from rotating beyond a final position. The one more support links 218 may provide support such that the one or more first lever arms 202 support a weight of the sub-chassis 104.

In one embodiment, the first lever arm 202 may include a slide surface 220. The final position of the one or more first lever arms 202 may include a position where the one or more slide surfaces 220 of the one or more first lever arms 202 are substantially planar with a bottom of the sub-chassis 104 such that as the sub-chassis 104 moves away from the chassis 102, the sub-chassis 104 slides along the slide surface 220 of each first lever arm 202. For example, in one embodiment, the stop of the one or more support links 218 may prevent each first lever arm 202 from rotating beyond a final position that is substantially planar with a bottom of the sub-chassis 104. The sub-chassis 104 may move away from the chassis 102 along the slide surface 220 of each first lever arm 202 and the one or more support links 218 may support the weight of the sub-chassis on the slide surface 220.

FIG. 6A depicts one embodiment of an apparatus 600 for a multifunction camming support shelf. The apparatus 600 may include a support link 218. In one embodiment, the support link 218 may include a first bar 602 coupled to a first lever arm 202. The first bar 602 may couple to the first lever arm 202 through a first support pivot point 606. The support link 218 may include a second bar 604 coupled to the chassis 102 or to a support frame 224 mounted to the side of the chassis 102, as described below. The second bar 604 may couple to the chassis 102 or support frame 224 through a second support pivot point 608. The support link 218 may include a connecting pivot point 610 connecting the first bar 602 and the second bar 604. In an alternative embodiment, the first bar 602 may couple to the second lever arm 206 connected to the first lever arm 202.

FIG. 6A depicts a first lever arm 202 moving away from the chassis 102. The first lever arm 202 may rotatably couple to the chassis 102 at the pivot point 210. As the first lever arm 202 rotates away from the chassis 102, the support link 218 may allow the first lever arm 202 to move away from the chassis 102 and into a final position. For example, in response to the one or more first lever arms 202 moving away from the chassis 102, the pivot point 606 may move away from the chassis 102. The pivot point 606 moving away from the chassis 102 may cause the first bar 602 and the second bar 604 to move such that the angle between first bar 602 and the second bar 604 becomes larger.

FIG. 6B depicts the first lever arm 202 in a final position. The final position may include the one or more first lever arms 202 being substantially planar to the bottom of the sub-chassis 104. The final position may include the first bar 602 and the second bar 604 being substantially parallel to each other, as depicted in FIG. 6B. The support link 218 may prevent each first lever arm 202 from rotating beyond the final position. Additionally, when the first lever arm 202 is in the final position, the support link 218 may provide support such that the one or more first lever arms 202 support a weight of the sub-chassis 104.

While FIGS. 6A and 6B depict the support link 218 as located between the chassis 102 or the support frame 224 and the first lever arm 202 and the second lever arm 206, the location of the support link 218 in relation to the first lever arm 202 and the second lever arm 206 is not limited to this depiction.

FIG. 7A depicts one embodiment an apparatus 700 of a multifunction camming support shelf. The apparatus 700 may include a support link 218. In one embodiment, the multifunction shelf 106 may include a curved bar 702 connected to the first lever arm 202 and a stop piece 704 connected to the curved bar 702. The stop piece 704 may stop movement of the support link 218 and the first lever arm 202 in response to the first lever arm 202 rotating away from the chassis 102 and into a final position.

FIG. 7A depicts a first lever arm 202 moving away from the chassis 102. The first lever arm 202 is rotatably coupled to the chassis 102 at the pivot point 210. As the first lever arm 202 rotates away from the chassis 102, the support link 218 may allow the first lever arm 202 to move away from the chassis 102 and into a final position.

FIG. 7B depicts the first lever arm 202 in a final position. The support link 218 may stop the movement of the first lever arm 202 from rotating beyond the final position in a variety of ways. For example, in one embodiment, the chassis 102 or the support frame 224 may include a support link aperture sized to allow the curved bar 702 to pass through and sized to prevent the stop piece 704 from passing through. The curved bar 702 may be a length such that the stop piece 704 engages with the side of the first end of the chassis 102 or the support frame 224 in response to the first lever arm 202 being substantially planar with the bottom of the sub-chassis 104. In another embodiment, the curved bar 702 may be located next to the side of the first end of the chassis 102 and may be a length such that the stop piece 704 engages with the side of the first end of the chassis 102 when the first lever arm 202 is substantially planar with the bottom of the front end of the chassis 102.

It should not be understood that the one or more support links 218 are limited to the embodiments depicted in FIGS. 6A, 6B, 7A, and 7B. One of skill in the art will recognize other ways that the one or more support links 218 may couple to the multifunction shelf 106 and the chassis 102, prevent each first lever arm 202 from rotating beyond a final position, and provide support such that the one or more first lever arms 202 may support a weight of the sub-chassis 104. Furthermore, while FIGS. 6A, 6B, 7A, and 7B depict the one or more support links 218 as coupled to the first lever arm 202, the one or more support links 218 may, alternatively, couple to the second lever arm 206 connected to the first lever arm 202. Additionally or alternatively, the one or more support links 218 may couple the first lever arm 202 or second lever arm 206 to the one or more support frames 224 as described below.

Returning to FIG. 2, in one embodiment, the first lever arm 202 may include one or more retention features 222 that connect the first lever arm 202 to the chassis 102 after the first lever arm 202 is in a position adjacent to the chassis 102. A retention feature 222 may support the one or more first lever arms 202 with limiting the movement of the sub-chassis 104 away from the chassis 102.

The retention feature 222 may support the one or more first lever arms 202 with limiting the movement of the sub-chassis 104 away from the chassis 102 in a variety of ways. For example, in one embodiment, the retention feature 222 may include a screw connected to the first lever arm 202. The retention feature 222 may screw into a portion on the first end of the chassis 102 or to the support frame 224 (described below) and secure the first lever arm 202 to the first end of the chassis 102 when the first lever arm 202 is adjacent to the first end of the chassis 102. In another embodiment, the retention feature 222 may include a latch that attaches to a portion on the first end of the chassis 102 or to the support frame 224 and secure the first lever arm 202 to the first end of the chassis 102 or to the support frame 224 when the first lever arm 202 is adjacent to the first end of the chassis 102. One of skill in the art will recognize other ways that the retention feature 222 may provide support in limiting the movement of the sub-chassis 104 away from the chassis 102.

In one embodiment, the apparatus 200 includes one or more support frames 224 mounted to the first end of the chassis 102. Each support frame 224 couples to one or more pivot points 210. Each support frame 224 includes one or more support links 218 coupled to the multifunction shelf 106. Each support link 218 includes a stop that prevents the one or more first lever arms 202 from rotating beyond a final position. The stop engages the support frame 224 at the final position.

For example, in one embodiment, the apparatus 200 may include a single support frame 224 that mounts to the chassis 102 or a support frame 224 on each side of the chassis 102. The support frame 224 may provide a way for the multifunction shelf 106 to mount to the chassis 102 as an interface between the chassis 102 and the multifunction shelf 106. For example, in one embodiment, the support frame 224 may couple to the multifunction shelf 106 through the one or more pivot points 210. The support frame 224, in one embodiment, is customized for the chassis 102. In another embodiment, the support frame 224 includes various mounting options to conform to several chassis designs.

The support frame 224 may include one or more pieces of rigid material, which may provide support for the multifunction shelf 106. The support frame 224 may mount to the first end of the chassis 102 in a variety of ways. For example, in one embodiment, the sides of the first end of the chassis 102 may include one or more threaded apertures. The support frame 224 may include one or more mounting apertures that may overlay the threaded apertures of the side of the first end of the chassis 102. One or more screws may pass through the one or more mounting apertures of the support frame 224 and couple with the one or more threaded apertures of the side of the first end of the chassis 102. The one or more mounting apertures of the support frame 224 may include a threaded interior or may include a smooth interior. In other embodiments, the support frame 224 may include pins, connectors, or other means to connect to the chassis 102. One of skill in the art will recognize other ways that the one or more support frames 224 may mount to the first end of the chassis 102.

In one embodiment, the support frame 224 may include one or more pivot apertures and the multifunction shelf 106 may include one or more protrusions. The one or more protrusions may insert into the one or more pivot apertures of the support frame 224 to form the one or more pivot points 210. In another embodiment, the support frame 224 may connect to the multifunction shelf 106 with one or more hinges that form the pivot points 210. The pivot apertures of the support frame 224 may be at the bottom of the support frame 224 near the bottom of the first end of the chassis 102. In another embodiment, the multifunction shelf 106 may include one or more pivot apertures and the support frame 224 may include one or more protrusions. The one or more protrusions of the support frame 224 may insert into the one or more pivot apertures of the multifunction shelf 106 to form the one or more pivot points 210. One of skill in the art will recognize other ways that the support frame 224 and the multifunction shelf 106 may form one or more pivot points 210.

In one embodiment, the support frame 224 may couple to one or more support links 218, such as the one or more support links 218 from FIGS. 6A-B and 7A-B. For example, in one embodiment, pivot point 608 from FIGS. 6A-B may couple to the support frame 224. Each support link 218 includes a stop that prevents the one or more first lever arms 202 from rotating beyond a final position. For example, in one embodiment, support link 218, as depicted in FIG. 6B, may prevent the one or more first lever arms 202 from rotating beyond a final position. In another embodiment, support link 218, as depicted in FIG. 7B, may prevent the one or more first lever arms 202 from rotating beyond a final position. The curved bar 702 of the support link 218 depicted in FIG. 7B may be a length such that the stop piece 704 engages with the support frame 224 in response to the first lever arm 202 being substantially planar with the bottom of the front end of the chassis 102.

In one embodiment, the support frame 224 may include a retention feature receiver 226. The retention feature 222 may engage with the retention feature receiver 226 to provide support in limiting the movement of the sub-chassis 104 away from the chassis 102. For example, in one embodiment, the retention feature 222 may include a screw connected to the first lever arm 202 and the retention feature receiver 226 may include a threaded aperture. The screw of the retention feature 222 may engage with the threaded aperture of the retention feature receiver 226 and connect the first lever arm 202 with the support frame 224. In another embodiment, the retention feature 222 may include a latch and the retention feature receiver 226 may include a receiving portion of the latch. The latch of the retention feature 222 may engage with the receiving portion of the latch of the retention feature receiver 226 and connect the first lever arm 202 with the support frame 224. One of skill in the art will recognize other ways that the retention feature receiver 226 engage with a retention feature 222 of the one or more first lever arms 202.

In one embodiment, the first lever arm may include one or more bezel retention features 228. Each bezel retention feature 228 may include a receiving area that receives a connection portion of a bezel. The bezel may include a front panel for covering a portion of the end of the sub-chassis 104 or the first end of the chassis 102. The bezel front panel may include one or more apertures that allow air to flow through the bezel. The one or more apertures may also allow cables, such as power cables, data cables, and the like, to pass through the bezel front panel. Additionally or alternatively, the one or more apertures may allow a user to see through the bezel front panel and see a portion of the sub-chassis 104.

A bezel retention feature 228 may receive a connection portion of a bezel in a variety of ways. For example, the bezel retention feature 228 may include a threaded aperture. The connection portion of a bezel may screw into the threaded aperture of the bezel retention feature 228 when the connection portion of the bezel is adjacent to the bezel retention feature 228. In another embodiment, the bezel retention feature 228 may include a receiving area for a latch. The bezel may include a latch that attaches to receiving area of the bezel retention feature 228 when the connection portion of the bezel is adjacent to the bezel retention feature 228. One of skill in the art will recognize other ways that the bezel retention feature 228 may receive a connection portion of a bezel.

In one embodiment, rotating the one or more first lever arms 202 toward the chassis 102 may apply a force through each corresponding second lever arm 206 and camming feature 208 to the sub-chassis 104 to connect the sub-chassis 104 to the chassis 102. For example, rotating a first lever arm 202 toward the chassis 102 may move the protrusion 302 of camming feature 208, as depicted in FIGS. 3A-D, into the channel 304 and engage with the channel 304. The rotation may apply a force through each corresponding second lever arm 206 and through the protrusion 302 to the sides of the channel 304, moving the sub-chassis 104 towards the chassis 102. The force may connect the sub-chassis 104 to the chassis 102.

In another embodiment, for example and as mentioned above, the camming feature may include one or more camming arms that may connect to the one or more first lever arms 202 or the one or more second lever arms 206. The one or more camming arms may include two or more prongs. The prongs may be positioned on the camming arm to engage with the sub-chassis 104 for different movements of the multifunction shelf 106. For example, in one embodiment, rotating the multifunction shelf 106 toward the chassis 102 may cause one or more prongs of the two or more prongs to engage with the sub-chassis 104. Rotating the multifunction shelf 106 may include applying a force through the one or more first lever arms 202 through the one or more prongs to connect the sub-chassis 104 to the chassis 102.

In one embodiment, rotating the one or more first lever arms 202 away from the chassis 102 may move the sub-chassis 104 away from the chassis 102. For example, in one embodiment, applying a force through each corresponding second lever arm 206 and camming feature 208 may include the one or more camming features 208 applying a force to the sub-chassis 104 and moving the sub-chassis 104 away from the chassis 102. In another embodiment, the chassis 102 may include an incline in the first end of the chassis 102 and disconnecting the sub-chassis 104 from the chassis 102 may allow the sub-chassis 104 to travel along the incline of the chassis 102. One of skill in the art will recognize other ways that rotating the one or more first lever arms 202 away from the chassis 102 may move the sub-chassis 104 away from the chassis 102.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
a multifunction shelf rotatably coupled to a chassis at one or more pivot points, the chassis sized for a computer rack and to hold one or more electronic components, the chassis comprising a sub-chassis mounted in a first end of the chassis, the sub-chassis connected to one or more connectors within the chassis, the multifunction shelf comprising:
one or more first lever arms, each first lever arm extending away from a pivot point of the one or more pivot points, wherein each first lever arm comprises a slide surface and wherein a final position of the one or more first lever arms comprises a position where the one or more slide surfaces are substantially planar with a bottom of the sub-chassis such that as the sub-chassis moves away from the chassis, the sub-chassis slides along the slide surface of each first lever arm;
one or more second lever arms, each second lever arm connected to a first lever arm of the one or more first lever arms and extending in a direction at a first angle to the connected first lever arm; and
one or more camming features, each camming feature coupled to a second lever arm of the one or more second lever arms and the sub-chassis, wherein rotating the one or more first lever arms away from the chassis applies a force through each corresponding second lever arm and camming feature to the sub-chassis to disconnect the sub-chassis from the chassis.

2. The apparatus of claim 1, wherein the one or more camming features engage the sub-chassis for a portion of movement of the first lever arm and allow movement of the sub-chassis without further movement of the first lever arm when the first lever arm is in a final position.

3. The apparatus of claim 1, wherein the one or more camming features comprise a channel and a protrusion that fits in the channel, wherein the channel is shaped so that the protrusion applies a force to a wall of the channel to apply the force to disconnect the sub-chassis during movement of the first lever arm and wherein the channel is shaped to allow the sub-chassis to move without further movement of the first lever arm when the first lever arm is in a final position.

4. The apparatus of claim 3, wherein the protrusion is coupled to the second lever arm and the channel is in the sub-chassis.

5. The apparatus of claim 1, wherein the one or more first lever arms further comprise:
two first lever arms disposed on each side of the first end of the chassis; and
one or more connecting members disposed between the two first lever arms and connected to the two first lever arms.

6. The apparatus of claim 1, wherein each first lever arm further comprises a guide wall, the guide wall connected to an edge portion of the first lever arm and extending in a direction substantially planar to sides of the sub-chassis, wherein the guide wall of each lever arm limits movement of the sub-chassis after each first lever arm is in a final position to a desired direction.

7. The apparatus of claim 1, wherein each first lever arm further comprises a hard stop on each first lever arm located distal to the pivot of the first lever arm, the hard stop positioned to inhibit movement of the sub-chassis along the first lever arm beyond the hard stop.

8. The apparatus of claim 1, further comprising one or more support links, each support link coupled to the multifunction shelf and the chassis, each support link comprising a stop that prevents each first lever arm from rotating beyond a final position, the one more support links providing support such that the one or more first lever arms support a weight of the sub-chassis.

9. The apparatus of claim 1, wherein each second lever arm direction extending at a first angle to the connected first lever arm comprises each second lever arm extending in a direction different from the connected first lever arm.

10. The apparatus of claim 8, wherein each support link for a first lever arm of the one or more first lever arms further comprises:
   a first bar coupled to the second lever arm that is connected to the first lever arm;
   a second bar coupled to the chassis; and
   a pivot connecting the first bar and the second bar.

11. The apparatus of claim 8, where each support link for a first lever arm of the one or more first lever arms comprises:
   a curved bar connected to the first lever arm; and
   a stop piece connected to the chassis that stops movement of the support link and the first lever arm in response to the first lever arm rotating away from the chassis to a final position.

12. The apparatus of claim 1, wherein each first lever arms comprises a retention feature that connects the first lever arm to the chassis after the first lever arm is in a position adjacent to the chassis, wherein the retention feature provides support in limiting movement of the sub-chassis away from the chassis.

13. The apparatus of claim 1, wherein the multifunction shelf further comprises one or more support frames, each support frame connected to the first end of the chassis, wherein each support frame couples to one or more pivot points and each support frame comprises one or more support links coupled to the multifunction shelf, wherein each support link comprises a stop that prevents the one or more first lever arm from rotating beyond a final position, wherein the stop engages the support frame at the final position.

14. The apparatus of claim 1, wherein each first lever arm further comprises one or more arm extensions, each arm extension lengthening the first lever arm connected to the arm extension.

15. The apparatus of claim 1, wherein the one or more first lever arms further comprise one or more bezel retention features, each bezel retention feature comprising a receiving area that receives a connection portion of a bezel.

16. The apparatus of claim 1, wherein rotating the one or more first lever arms toward the chassis applies a force through each corresponding second lever arm and camming feature to the sub-chassis to connect the sub-chassis to the chassis.

17. The apparatus of claim 1, wherein rotating the one or more first lever arms away from the chassis moves the sub-chassis away from the chassis.

18. The apparatus of claim 1, wherein each second lever arm connected to a first lever arm extends in a direction perpendicular to the connected first lever arm.

19. A system comprising:
   a chassis sized for a computer rack and to hold one or more electronic components;
   a sub-chassis mounted in a first end of the chassis, the sub-chassis connected to one or more connectors within the chassis; and
   a multifunction shelf rotatably coupled to the chassis at one or more pivot points, the multifunction shelf comprising:
      one or more first lever arms, each first lever arm extending away from a pivot point of the one or more pivot points, wherein each first lever arm comprises a slide surface and wherein a final position of the one or more first lever arms comprises a position where the one or more slide surfaces are substantially planar with a bottom of the sub-chassis such that as the sub-chassis moves away from the chassis, the sub-chassis slides along the slide surface of each first lever arm;
      one or more second lever arms, each second lever arm connected to a first lever arm of the one or more first lever arms and extending in a direction at a first angle to the connected first lever arm; and
      one or more camming features, each camming feature coupled to a second lever arm of the one or more second lever arms and the sub-chassis, wherein rotating the one or more first lever arms away from the chassis applies a force through each corresponding second lever arm and camming feature to the sub-chassis to disconnect the sub-chassis from the chassis.

20. An apparatus comprising:
a multifunction shelf rotatably coupled to a chassis at one or more pivot points, the chassis sized for a computer rack and to hold one or more electronic components, the chassis comprising a sub-chassis mounted in a first end of the chassis, the sub-chassis connected to one or more connectors within the chassis, the multifunction shelf comprising:
   two first lever arms, one first lever arm disposed on each side of the first end of the chassis, each first lever arm extending away from a pivot point of the one or more pivot points, wherein each first lever arm comprises:
      a hard stop located distal to the pivot of each first lever arm, the hard stop positioned to inhibit movement of the sub-chassis along the one or more first lever arms beyond the hard stop;
      a guide wall connected to an edge portion of each first lever arm and extending in a direction substantially planar to sides of the sub-chassis, wherein the guide wall of each lever arm limits movement of the sub-chassis after each first lever arm is in a final position to a desired direction;
      a support link, support link coupled to the multifunction shelf and the chassis, the support link comprising a stop that prevents the first lever arm from rotating beyond a final position, the support link providing support such that the two first lever arms support a weight of the sub-chassis; and
      a slide surface, wherein a final position of the one or more first lever arms comprises a position where the one or more slide surfaces are substantially planar with a bottom of the sub-chassis such that as the sub-chassis moves away from the chassis, the sub-chassis slides along the slide surface of each first lever arm;
   two second lever arms, each second lever arm connected to a first lever arm of the two first lever arms and extending in a direction perpendicular to the connected first lever arm; and
   two camming features, each camming feature coupled to a second lever arm of the two second lever arms and the sub-chassis, wherein rotating the first lever arms away from the chassis applies a force through each corresponding second lever arm and camming feature to the sub-chassis to disconnect the sub-chassis from the chassis.

* * * * *